US010340143B1

(12) United States Patent
Liu et al.

(10) Patent No.: US 10,340,143 B1
(45) Date of Patent: Jul. 2, 2019

(54) ANODIC ALUMINUM OXIDE AS HARD MASK FOR PLASMA ETCHING

(71) Applicant: Lam Research Corporation, Fremont, CA (US)

(72) Inventors: Chanyuan Liu, Tigard, OR (US); Shih-Ked Lee, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/006,786

(22) Filed: Jun. 12, 2018

(51) Int. Cl.
| H01L 21/00 | (2006.01) |
| H01L 21/033 | (2006.01) |
| H01L 21/027 | (2006.01) |
| H01L 21/326 | (2006.01) |
| H01L 21/02 | (2006.01) |
| H01L 21/311 | (2006.01) |

(52) U.S. Cl.
CPC ...... *H01L 21/0338* (2013.01); *H01L 21/0274* (2013.01); *H01L 21/02178* (2013.01); *H01L 21/02258* (2013.01); *H01L 21/0332* (2013.01); *H01L 21/0335* (2013.01); *H01L 21/0337* (2013.01); *H01L 21/31122* (2013.01); *H01L 21/326* (2013.01)

(58) Field of Classification Search
CPC .......... H01L 21/0338; H01L 21/02178; H01L 21/02258; H01L 21/0274; H01L 21/0332; H01L 21/0335; H01L 21/0337
See application file for complete search history.

(56) References Cited

U.S. PATENT DOCUMENTS

| 4,681,666 | A | * | 7/1987 | Potter | ................... | C25D 11/04 |
| | | | | | | 205/118 |
| 2008/0143015 | A1 | * | 6/2008 | Lee | ................... | H01L 21/31687 |
| | | | | | | 264/220 |

* cited by examiner

*Primary Examiner* — Richard A Booth
(74) *Attorney, Agent, or Firm* — Penilla IP, APC

(57) ABSTRACT

A seed layer of aluminum is deposited over a wafer. A layer of photoresist material is deposited over the seed layer of aluminum. The photoresist material is patterned and developed to expose portions of the seed layer of aluminum through openings in the photoresist material. An electrochemical transformation process is performed on the wafer to electrochemically transform the portions of the seed layer of aluminum that are exposed through openings in the photoresist material into anodic aluminum oxide (AAO). The AAO includes a pattern of holes that extend through the AAO to expose areas of the top surface of the wafer beneath the seed layer of aluminum. The photoresist material is removed from the wafer. The wafer is exposed to a plasma to etch holes into the wafer at the areas of the top surface of the wafer that are exposed by the pattern of holes in the AAO.

20 Claims, 10 Drawing Sheets

ANODIC ALUMINUM OXIDE AS HARD MASK FOR PLASMA ETCHING

BACKGROUND

1. Field of the Disclosure

The present disclosure relates to semiconductor device fabrication.

2. Description of the Related Art

Plasma etching processes are often used in the manufacture of semiconductor devices. In the plasma etching process, a semiconductor wafer that includes semiconductor devices under manufacture is exposed to a plasma that interacts with at least one material on the semiconductor wafer so as to remove the at least one material. The plasma can be generated using specific reactant gases that will cause constituents of the plasma to interact with the material(s) to be removed from the semiconductor wafer, without significantly interacting with other materials on the wafer that are not to be removed. Also, in some plasma etching processes, a bias voltage can be applied to the semiconductor wafer to enable anisotropic etching of features on the semiconductor wafer by attracting charged constituents of the plasma toward the semiconductor wafer in a more perpendicular direction. It is within this context that the present disclosure arises.

SUMMARY

In an example embodiment, a method is disclosed for performing a plasma etching process. The method includes depositing a seed layer of aluminum over a top surface of a wafer. The method also includes depositing a layer of photoresist material over the seed layer of aluminum. The method also includes patterning and developing the layer of photoresist material to expose one or more portions of the seed layer of aluminum through openings in the photoresist material. The method also includes performing an electrochemical transformation process on the wafer to electrochemically transform the one or more portions of the seed layer of aluminum that are exposed through openings in the photoresist material into anodic aluminum oxide. The anodic aluminum oxide includes a pattern of holes that extend through the anodic aluminum oxide to expose areas of the top surface of the wafer beneath the seed layer of aluminum. The method also includes removing the photoresist material from the wafer. The method also includes exposing the wafer to a plasma to etch holes into the wafer at the areas of the top surface of the wafer that are exposed by the pattern of holes in the anodic aluminum oxide.

In an example embodiment, a method is disclosed for performing a plasma etching process. The method includes depositing a seed layer of aluminum over a top surface of a wafer. The method also includes depositing a layer of mask material over the seed layer of aluminum. The method also includes depositing a layer of photoresist material over the layer of mask material. The method also includes patterning and developing the layer of photoresist material to expose one or more portions of the mask material. The method also includes removing the one or more portions of the mask material to expose corresponding portions of the seed layer of aluminum. The method also performing an electrochemical transformation process on the wafer to electrochemically transform the corresponding exposed portions of the seed layer of aluminum into anodic aluminum oxide. The anodic aluminum oxide includes a pattern of holes that extend through the anodic aluminum oxide to expose areas of the top surface of the wafer beneath the seed layer of aluminum. The method also includes exposing the wafer to a plasma to etch holes into the wafer at the areas of the top surface of the wafer that are exposed by the pattern of holes in the anodic aluminum oxide.

DETAILED DESCRIPTION

In the following description, numerous specific details are set forth in order to provide an understanding of embodiments of the present disclosure. It will be apparent, however, to one skilled in the art that embodiments the present disclosure may be practiced without some or all of these specific details. In other instances, well known process operations have not been described in detail in order not to unnecessarily obscure the present disclosure.

Figure 1A:
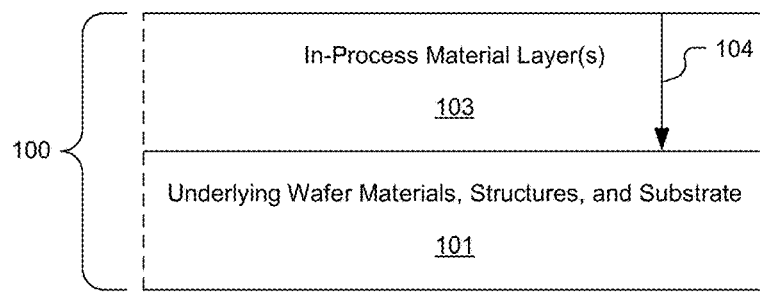
FIG. 1A shows a vertical cross-section through a section of a semiconductor wafer.

FIG. 1A shows a vertical cross-section through a section of a semiconductor wafer 100 ("wafer" hereafter). The wafer 100 includes one or more in-process material layer(s) 103 that extend from a top surface of the wafer 100 down to some depth 104 within the wafer 100. Below the depth 104, the wafer 100 includes an underlying section 101 that includes underlying wafer materials, structures, and a substrate. In various embodiments, the wafer 100 may vary in form, shape, and/or size. For example, in some embodiments, the wafer 100 referred to herein may correspond to a 200 mm (millimeter) diameter semiconductor wafer, a 300 mm diameter semiconductor wafer, or a 450 mm diameter semiconductor wafer. Also, in some embodiments, the wafer 100 referred to herein may have a non-circular shape, such as a rectangular substrate for a flat panel display, or the like, among other shapes.

In some embodiments, the in-process material layer(s) 103 can include a stack of materials. For example, in the case of 3D NAND integrated circuit manufacturing, the in-process material layer(s) 103 can include an ONON stack (oxide/nitride stack) and/or an OPOP stack (oxide/polysilicon stack). The ONON stack is a vertical stack of alternating oxide film and nitride film. The OPOP stack is a vertical stack of alternating oxide film and polysilicon film. Depending on the memory density of the 3D NAND integrated circuit, each of the ONON stack and the OPOP stack can include up to 60 or more film layers. The 3D NAND integrated circuit also includes channels that are formed to extend vertically through the entire ONON stack or OPOP stack. The channels are formed in part by etching channel holes down through the ONON stack or OPOP stack. At full depth, the channel holes can have aspect ratios (i.e., the ratio of hole depth to hole width (hole depth:hole width)) of up to 40:1 or more. One challenge for the manufacture of 3D NAND integrated circuits is the etching of the channel holes to full depth.

Figure 1B:
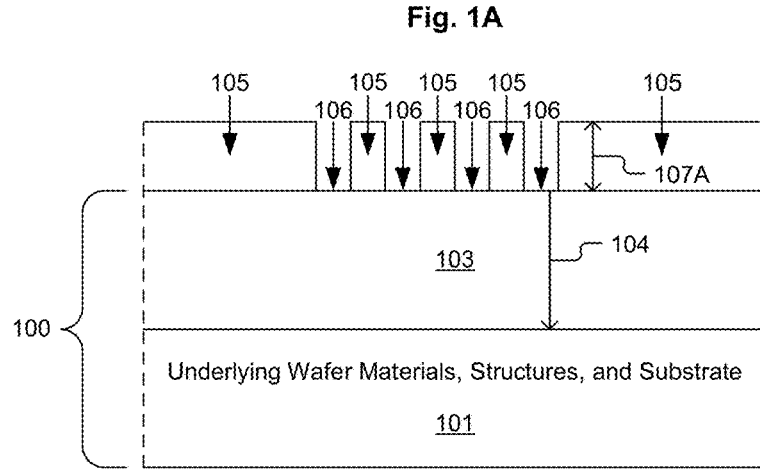
FIG. 1B shows the vertical cross-section through the section of the wafer of FIG. 1A, with a patterned and developed hardmask material deposited on the top surface of the wafer.

FIG. 1B shows the vertical cross-section through the section of the wafer 100 of FIG. 1A, with a patterned and developed hardmask material 105 deposited on the top surface of the wafer 100, i.e., the top exposed surface of the in-process material layer(s) 103. The hardmask material 105 is patterned and developed to expose areas 106 of the top surface of the in-process material layer(s) 103 where holes are to be etched, such as where channel holes are to be etched for 3D NAND integrated circuit manufacturing. During a plasma etching process to form the holes at the areas 106, the hardmask material 105 is intended to protect the other areas of the in-process material layer(s) 103 that are covered by the hardmask material 105.

As the holes are plasma etched at the areas 106, the material(s) within the in-process material layer(s) 103 at the areas 106 will be removed at a first etch rate, and the hardmask material 105 will be removed at a second etch rate. The selectivity of the plasma etching process is the ratio of the first etch rate to the second etch rate, i.e., the ratio of the etch rate through the in-process material layer(s) 103 to the etch rate of the hardmask material 105. The selectivity should be sufficiently high so that a target etch depth can be reached at the areas 106 before the hardmask material 105 is removed to an extent that the hardmask material 105 can no longer provide protection for the underlying in-process material layer(s) 103.

Figure 1C:
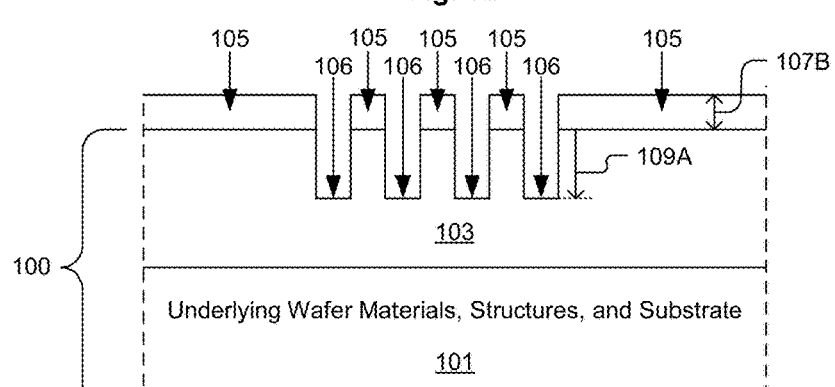
FIG. 1C shows the vertical cross-section through the section of the wafer of FIG. 1B after holes have been etched to a partial depth.
Figure 1D:
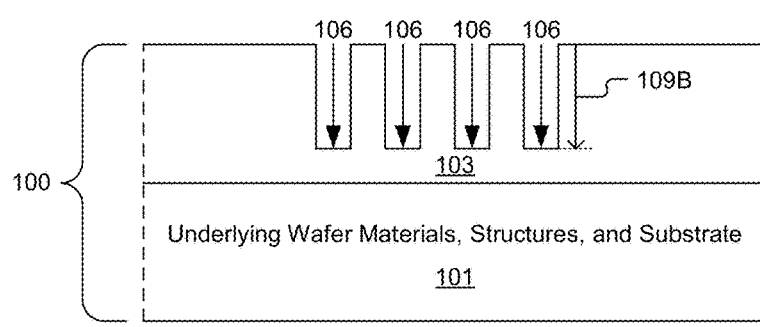
FIG. 1D shows the vertical cross-section through the section of the wafer of FIG. 1C after further etching and at a time when the hardmask material is completely removed.

As shown in FIG. 1B, the hardmask material 105 is deposited with an initial thickness 107A. FIG. 1C shows the vertical cross-section through the section of the wafer 100 of FIG. 1B after holes have been etched at the areas 106 to a partial depth 109A. FIG. 1C also shows that the hardmask material 105 has been reduced to a thickness 107B by the time the holes reach the partial depth 109A. FIG. 1D shows the vertical cross-section through the section of the wafer 100 of FIG. 1C after further etching and at a time when the hardmask material 105 is completely removed. As shown in FIG. 1D, the holes have only been etched at the areas 106 to a partial depth 109B. But, the holes are specified to be etched at the areas 106 through the full depth 104 of the in-process material layer(s) 103. Therefore, in the example of FIGS. 1A-1D, the hardmask material 105 does not provide sufficient selectivity to enable complete etching of the holes at the areas 106.

In 3D NAND integrated circuit manufacturing processes, a fluorine-based plasma etching process is used to form channel holes of very high aspect ratio through ONON and/or OPOP stacks. Some carbon-containing hardmask materials have been used in the fluorine-based plasma etching process to form channel holes, such as carbon-based hardmask material and/or doped-carbon-based hardmask material and/or metal-carbide hardmask material. These carbon-containing hardmask materials will form carbon fluoride (CF4) in the presence of the fluorine-based plasma etching process. And, because carbon fluoride is volatile at room temperature, the carbon fluoride will be lost and the carbon-containing hardmask material will be correspondingly removed during the fluorine-based plasma etching process. As the ONON and/or OPOP stacks are formed to have greater overall vertical thickness, the required etch depth for formation of channel holes through the ONON and/or OPOP stacks becomes greater, and the etch selectivity using the carbon-containing hardmask material becomes too low to achieve full etch depth in the presence of the fluorine-based plasma etching process. Also, even the high-selectivity hardmask material of tungsten carbide will form volatile tungsten fluoride (WF6), resulting in inadequate etch selectivity that can limit the ONON and/or OPOP stack number and overall vertical thickness.

In the fluorine-based plasma etching process, a carbon-containing hardmask material initial thickness of 2.5 micrometers provides for a total etch depth of about 5 to 6 micrometers through the ONON stack. Therefore, to scale the ONON stack thickness from 5 to 6 micrometers to about 10 micrometers, the carbon-containing hardmask material initial thickness would need to be doubled from 2.5 micrometers to more than 5 micrometers. However, this is not possible, because the current maximum achievable carbon-containing hardmask material initial thickness is about 2.5 micrometers. Therefore, use of carbon-containing hardmask material in the fluorine-based plasma etching process to manufacture 3D NAND integrated circuits limits the achievable overall etch depth for channel hole formation, which in turn limits the overall vertical thickness of the ONON and/or OPOP stack, which in turn limits the achievable memory density.

In order to maximize etch selectivity in the fluorine-based plasma etching process, it is of interest to use a hardmask material that does not form a volatile fluoride byproduct. One material that can survive a fluorine-based etchant is aluminum oxide (Al2O3). In the fluorine-based plasma etching process, a hardmask of aluminum oxide has high etch selectivity against silicon (Si), polysilicon (polySi), silicon oxide (SiO), and silicon nitride (SiN). Also, exposure of aluminum oxide to the fluorine-based etching processes causes formation of aluminum fluoride (AlF3), which is not volatile and will persist and stay in place as a hardmask material. However, there are some challenges with regard to use of aluminum oxide as a hardmask material.

For example, one challenge with use of aluminum oxide as a hardmask material is that it is difficult to deposit a layer of aluminum oxide on the wafer without causing deposition of aluminum oxide on other structures and components within the processing chamber. For example, when a plasma chemical vapor deposition (PCVD) process is used to deposit a film of aluminum oxide on the wafer, the aluminum oxide will also be deposited on chamber structures and components in exposure to the PCVD process. Because dry cleaning methods used to clean the processing chamber are fluorine-based, the dry cleaning methods cause transformation of the aluminum oxide into aluminum fluoride, which is non-volatile and itself difficult to clean. Therefore, it should be appreciated that use of the PCVD process to directly deposit aluminum oxide on the wafer is problematic due to concerns with regard to cleaning of aluminum oxide and aluminum fluoride from within the processing chamber. Also, when an atomic layer deposition (ALD) process is used to grow a film of aluminum oxide on the wafer, the aluminum oxide will also be grown on chamber structures and components in exposure to the ALD process. Therefore, as with the PCVD process, it should be appreciated that the ALD process to directly deposit aluminum oxide on the wafer is also problematic due to concerns with regard to cleaning of aluminum oxide and aluminum fluoride from within the processing chamber. Another challenge with use of aluminum oxide as a hardmask material is that it is difficult to form openings in the aluminum oxide through which etching of underlying materials can be done. More specifically, because aluminum oxide is inert to most etchants, it is difficult to etch openings through the aluminum oxide hardmask material at the areas where the underlying in-process material layer(s) are to be subsequently etched.

Methods are disclosed herein for using aluminum oxide as a hardmask material in a plasma etching process, and more particularly in a fluorine-based plasma etching process. The methods disclosed herein provide for use of aluminum oxide as the hardmask material while avoiding the above-mentioned processing chamber cleaning and hardmask opening challenges. Specifically, the methods disclosed herein include formation of a self-assembled anodic aluminum oxide (AAO) hardmask for use in etching high aspect ratio features into underlying in-process material layer(s). The self-assembled AAO hardmask is formed by applying positive voltage to a seed layer of aluminum that is simultaneously exposed to an electrochemical solution. A patterned mask is formed over the seed layer of aluminum so that the electrochemical solution is allowed to contact only the portions of the seed layer of aluminum that are to be transformed into the AAO hardmask. When the AAO hardmask is formed, holes are intrinsically formed within the AAO hardmask. The holes within the AAO hardmask extend through the AAO hardmask to expose the top surface of the underlying in-process material layer(s) into which high aspect ratio features are to be etched. Like aluminum oxide, the AAO hardmask is inert to many etchant materials including fluorine. Therefore, the AAO hardmask provides very high selectivity for etching high aspect ratio features using a fluorine-based plasma etching process. Also, in some embodiments, portions of the seed layer of aluminum that are not transformed into AAO, can be oxidized in-situ (such as through a thermal oxidation process) to form a dense film of aluminum oxide, which serves as a solid, i.e., non-perforated, hardmask of high selectivity for etching high aspect ratio features using a fluorine-based plasma etching process.

Figure 2A:
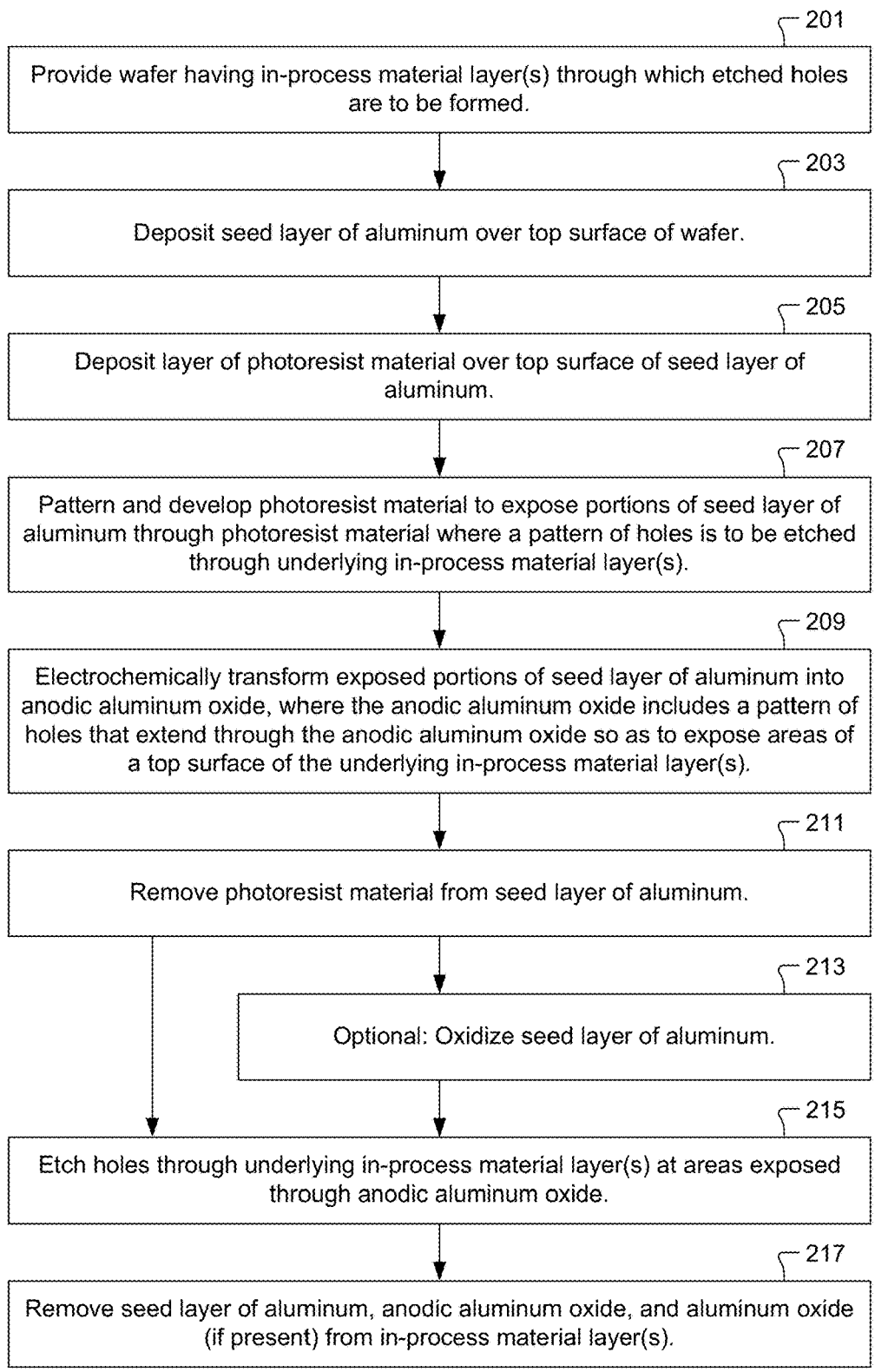
FIG. 2A shows a flowchart of a method for performing a plasma etching process that includes formation and use of anodic aluminum oxide (AAO) as a hardmask, in accordance with some embodiments.

FIG. 2A shows a flowchart of a method for performing a plasma etching process that includes formation and use of AAO as a hardmask, in accordance with some embodiments. The method includes an operation 201 for providing the wafer 100 that has the one or more in-process material layer(s) 103 through which etched holes are to be formed. As described with regard to FIG. 1A, the in-process material layer(s) 103 are formed over the underlying section 101 of the wafer 100 that includes underlying wafer materials, structures, and a substrate. In some embodiments, the in-process material layer(s) 103 include an ONON stack and/or an OPOP stack, such as in 3D NAND integrated circuit manufacturing. However, in various embodiments, the in-process material layer(s) 103 can include essentially any material or combination of materials through which holes are to be etched using a plasma-based etching process. The method continues with an operation 203 in which a seed layer of aluminum 301 is deposited over the top surface of the wafer 100, i.e., over the top surface of the in-process material layer(s) 103 through which holes are to be etched. It should be understood that the seed layer of aluminum deposited in operation 203 is aluminum metal (Al).

Figure 3A:
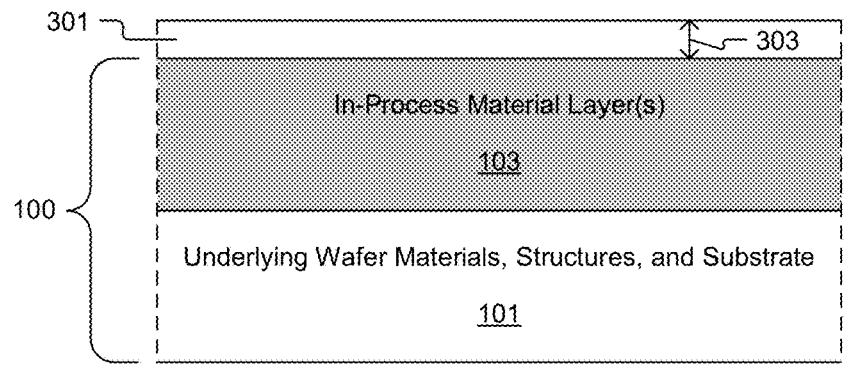
FIG. 3A shows a vertical cross-section through a section of the wafer after deposition of the seed layer of aluminum, in accordance with some embodiments.

FIG. 3A shows a vertical cross-section through a section of the wafer 100 after completion of operation 203 to deposit the seed layer of aluminum 301, in accordance with some embodiments. FIG. 3A shows the seed layer of aluminum 301 deposited over the in-process material layer(s) 103. In various embodiments, the seed layer of aluminum 301 can have a thickness 303 ranging from about 100 nanometers to about 50 micrometers. In some embodiments, the thickness 303 of the seed layer of aluminum 301 is about 2500 nanometers. It should be understood that the thickness 303 of the seed layer of aluminum 301 can be dependent on a depth to be etched into the in-process material layer(s) 103. In other words, because the thickness 303 of the seed layer of aluminum 301 is correlated to the thickness of the AAO hardmask to be formed later in the method, the required thickness 303 of the seed layer of aluminum 301 can be dependent on the etch selectivity provided by the AAO hardmask and the depth to be etched into the in-process material layer(s) 103. In some embodiments, it is of interest to form the thickness 303 of the seed layer of aluminum 301 as small as possible to reduce an overall aspect ratio of features to be etched into the underlying in-process material layer(s) 103 through holes within the AAO hardmask that is formed from the seed layer of aluminum 301. In some embodiments, the seed layer of aluminum 301 is deposited on the wafer 100 using a sputtering process. It should be understood that the seed layer of aluminum 301 can be deposited on the wafer 100 in a tool/chamber separate from the plasma etch processing chamber.

Figure 3B:
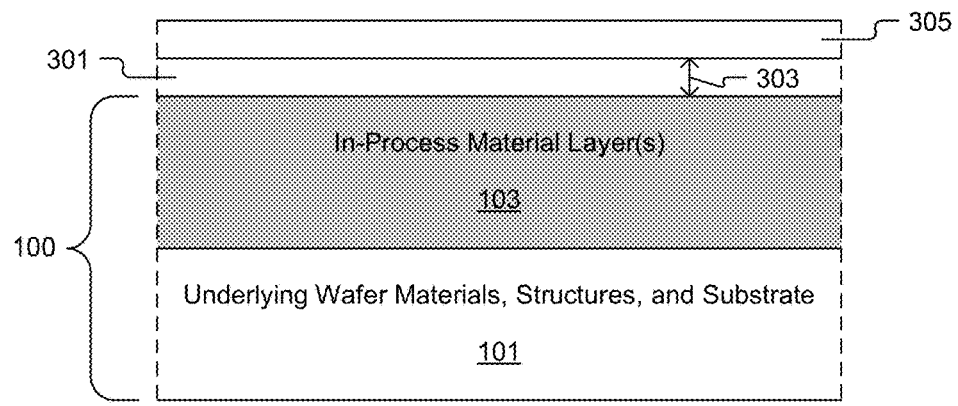
FIG. 3B shows the vertical cross-section through the section of the wafer as shown in FIG. 3A after deposition of the layer of photoresist material, in accordance with some embodiments.
Figure 3C:
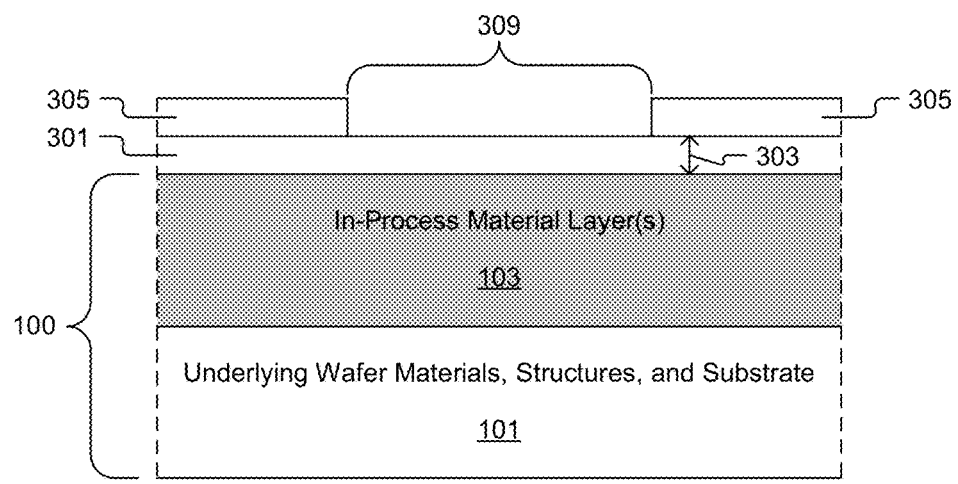
FIG. 3C shows the vertical cross-section through the section of the wafer as shown in FIG. 3B after patterning and developing the layer of photoresist material, in accordance with some embodiments.

The method continues with an operation 205 for depositing a layer of photoresist material 305 over a top surface of the seed layer of aluminum 301. FIG. 3B shows the vertical cross-section through the section of the wafer 100 as shown in FIG. 3A after completion of operation 205 to deposit the layer of photoresist material 305, in accordance with some embodiments. In an operation 207, the photoresist material 305 is patterned and developed to reveal/expose portions of the seed layer of aluminum 301 in prescribed areas 309 where a pattern of holes is to be etched through the underlying in-process material layer(s) 103. It should be understood that the photoresist material 305 remains on portions of the seed layer of aluminum 301 that are not in the prescribed areas 309 where the pattern of holes is to be etched through the underlying in-process material layer(s) 103. For example, in 3D NAND integrated circuit manufacturing, during a memory hole etching process, the photoresist material 305 can be patterned and developed to protect peripheral areas around the memory array, so that the peripheral areas around the memory array can be opened in later manufacturing operations to form required slits and stair case structures. Therefore, in this example, the photoresist material 305 can be patterned and developed to protect areas of the wafer 100 that are not prescribed areas 309 where memory hole etching is to be performed. FIG. 3C shows the vertical cross-section through the section of the wafer 100 as shown in FIG. 3B after completion of operation 207 to pattern and develop the layer of photoresist material 305, in accordance with some embodiments. In the example of FIG. 3C, the patterning and developing of the photoresist material 305 in the operation 207 reveals/exposes the top surface of the seed layer of aluminum 301 in the prescribed area 309 where the pattern of holes is to be etched through the underlying in-process material layer(s) 103. In various embodiments, the photoresist material 305 can be either a positive photoresist material or a negative photoresist material 305. For example, in various embodiments, the photoresist material 305 can be a positive photoresist such as Shepley 1813 or a negative photoresist material such as SUB, among others.

Figure 3D:
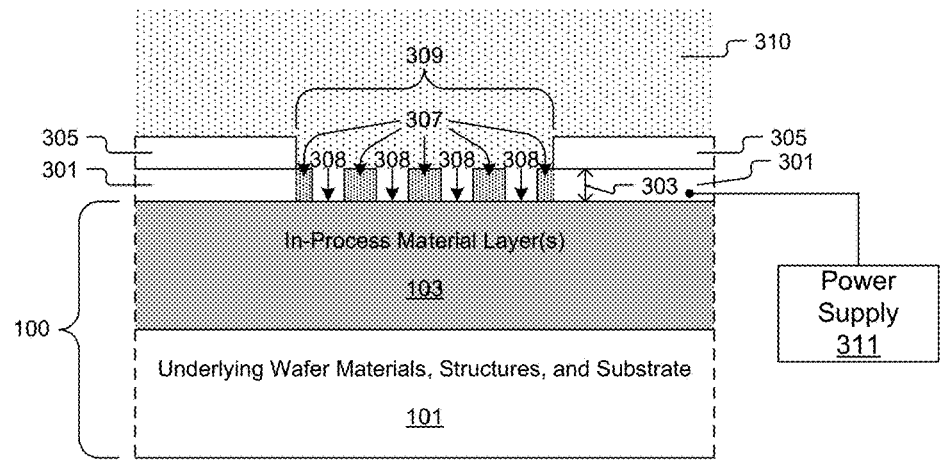
FIG. 3D shows the vertical cross-section through the section of the wafer as shown in FIG. 3C during an operation to electrochemically transform the exposed portion of the seed layer of aluminum into AAO so as to reveal/expose areas of the top surface of the underlying in-process material layer(s), in accordance with some embodiments.
Figure 3E:
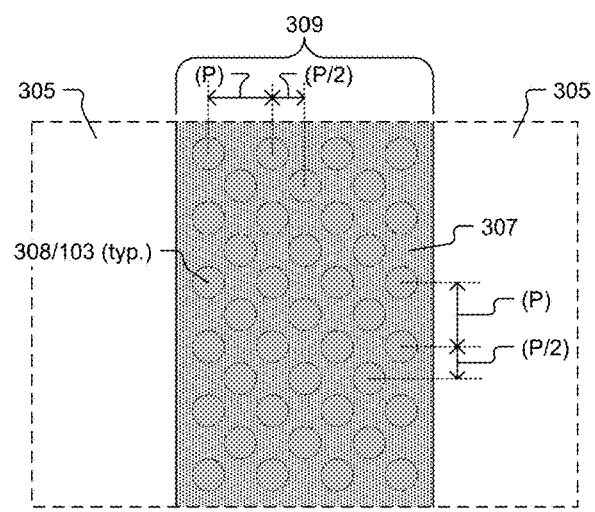
FIG. 3E shows a top view of the section of the wafer as shown in FIG. 3D after completion of the operation to electrochemically transform the exposed portion of the seed layer of aluminum into AAO so as to reveal/expose areas of the top surface of the underlying in-process material layer(s), in accordance with some embodiments.

From the operation 207, the method continues with an operation 209 for electrochemically transforming exposed portions of the seed layer of aluminum 301 into anodic aluminum oxide (AAO) 307. The AAO 307 includes a pattern of holes that extend through the AAO 307 so as to reveal/expose areas 308 of the top surface of the underlying in-process material layer(s) 103. FIG. 3D shows the vertical cross-section through the section of the wafer 100 as shown in FIG. 3C during operation 209 to electrochemically transform the exposed portion of the seed layer of aluminum 301 in the prescribed area 309 into AAO 307 so as to reveal/expose the areas 308 of the top surface of the underlying in-process material layer(s) 103, in accordance with some embodiments. FIG. 3E shows a top view of the section of the wafer 100 as shown in FIG. 3D after completion of operation 209 to electrochemically transform the exposed portion of the seed layer of aluminum 301 in the prescribed area 309 into AAO 307 so as to reveal/expose the areas 308 of the top surface of the underlying in-process material layer(s) 103, in accordance with some embodiments.

Figure 2B:
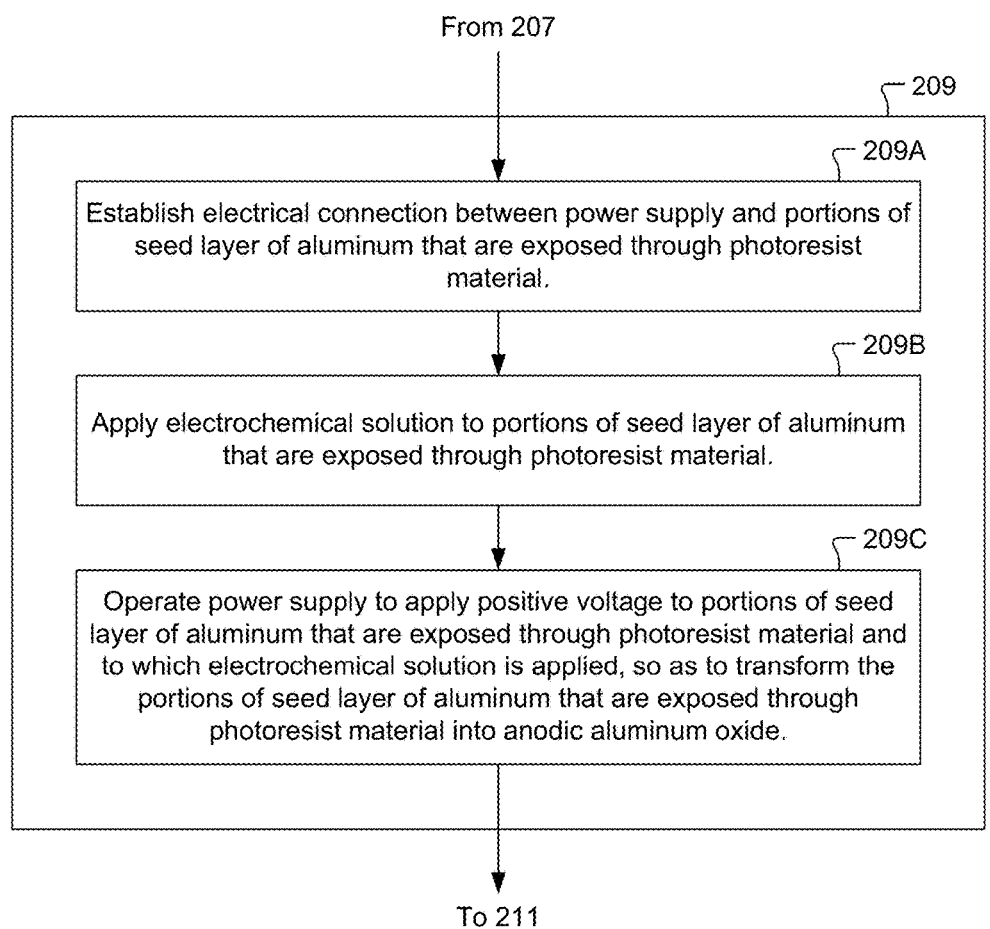
FIG. 2B shows a more detailed flowchart of the operation for electrochemically transforming exposed portions of the seed layer of aluminum into AAO, in accordance with some embodiments.

FIG. 2B shows a more detailed flowchart of the operation 209 for electrochemically transforming exposed portions of the seed layer of aluminum 301 into AAO 307, in accordance with some embodiments. Operation 209 includes an operation 209A for establishing an electrical connection between a power supply 311 and the portions of the seed layer of aluminum 301 that are exposed through openings the photoresist material 305 in the prescribed areas 309. Operation 209 also includes an operation 209B for applying an electrochemical solution 310 to the portions of the seed layer of aluminum 301 that are exposed through openings in the photoresist material 305 in the prescribed areas 309. Operation 209 also includes an operation 209C for operating the power supply 311 to apply a positive voltage to the portions of the seed layer of aluminum 301 that are exposed through openings in the photoresist material 305 and to which the electrochemical solution 310 is applied in the operation 209B, so as to transform the portions of the seed layer of aluminum 301 that are exposed through openings in the photoresist material 305 into AAO 307. In the operation 209C, the seed layer of aluminum 301 serves as a physically continuous electrical conduction layer so that electrical current can flow through the seed layer of aluminum 301 across the wafer 100. In some embodiments, the seed layer of aluminum 301 can be contacted at multiple locations around the periphery of the wafer 100 to provide for substantially uniform electrical current distribution through the seed layer of aluminum 301 across the wafer 100. In some embodiments, a ring-shaped electrode can be used to contact the seed layer of aluminum 301 around the periphery of the wafer 100 to provide for substantially uniform electrical current distribution through the seed layer of aluminum 301 across the wafer 100. In this manner, operation 209A can include establishing a physically continuous electrical connection between the power supply 311 and the seed layer of aluminum 301 around a complete periphery of the wafer 100.

During operation 209, AAO 307 grows at the interface between the aluminum metal (of the seed layer of aluminum 301) and the AAO 307 by way of inward migration of oxygen-containing anions (O2− and/or OH−) into the seed layer of aluminum 301 from the electrochemical solution 310. Also, as the AAO 307 grows inward within the seed layer of aluminum 301 from the electrochemical solution 310, aluminum cations (Al3+) are released from the seed layer of aluminum 301 into the electrochemical solution 310. Therefore, during transformation of the seed layer of aluminum 301 into AAO 307, both Al3+ cations and oxygen-containing anions (O2− and/or OH−) are mobile within the AAO 307 in the presence of a sufficiently high electric field provided by the positive voltage applied to the seed layer of aluminum 301.

In various embodiments, the electrochemical solution 310 includes one or more acid electrolytes, such as phosphoric acid (H3PO4), sulfuric acid (H2SO4), oxalic acid (H2C2O4), selenic acid (H2SeO4), chromic acid (H2CrO4), malonic acid (C3H4O4), tartaric acid (C4H6O6), citric acid (C6H8O7), malic acid (C4H6O5), among others. Example compositions of the electrochemical solution are provided in "Porous Anodic Aluminum Oxide: Anodization and Templated Synthesis of Functional Nanostructures," by Woo Lee and Sang-Joon Park, Chemical Reviews 2014, 114, pages 7487-7556, American Chemical Society Publications, Jun. 13, 2014 ("Lee" hereafter), which is incorporated herein by reference in its entirety. Also, Lee provides examples of processes for forming AAO from a layer of aluminum metal that can be used in performing operation 209.

During transformation of the seed layer of aluminum 301 into AAO 307, the reactions shown in Equations 1 and 2 can occur at the interface between the aluminum metal (in the seed layer of aluminum 301) and the AAO 307 that is forming from the seed layer of aluminum 301.

$$Al \rightarrow Al_{(ox)}^{3+} + 3e^{-} \qquad \text{Equation 1.}$$

$$2Al_{(ox)}^{3+} + 3O_{(ox)}^{2-} \rightarrow Al_2O_3 \qquad \text{Equation 2.}$$

During transformation of the seed layer of aluminum 301 into AAO 307, the reactions shown in Equations 3 through 7 can occur at the interface between the electrochemical solution 310 and the AAO 307 that is forming from the seed layer of aluminum 301.

$$2Al_{(ox)}^{3+} + 3O_{(ox)}^{2-} \rightarrow Al_2O_3 \qquad \text{Equation 3.}$$

$$Al_2O_3 + 6H_{(aq)}^{+} \rightarrow 2Al_{(aq)}^{3+} + 3H_2O_{(l)} \qquad \text{Equation 4.}$$

$$Al_{(ox)}^{3+} \rightarrow Al_{(aq)}^{3+} \qquad \text{Equation 5.}$$

$$2O_{(ox)}^{2-} \rightarrow O_{2(g)} + 4e^{-} \qquad \text{Equation 6.}$$

$$2H_2O_{(l)} + O_{(ox)}^{2-} \rightarrow OH_{(ox)}^{-} + 3H_{(aq)}^{+} \qquad \text{Equation 7.}$$

The photoresist material 305 serves to prevent the electrochemical solution 310 from contacting the seed layer of aluminum 301 at locations on the wafer 100 that are not within the prescribed areas 309 where the AAO 307 is to be formed. In the method of FIGS. 2A and 2B, the photoresist material 305 is chemically stable in exposure to the electrochemical solution 310. For example, if the electrochemical solution 310 is either acidic or alkaline, the photoresist material 305 is chemically stable in the presence of either the acidity or alkalinity of the electrochemical solution 310. Also, in the method of FIGS. 2A and 2B, the photoresist material 305 is selected to prevent ion exchange through the photoresist material 305 between the electrochemical solution 310 and the seed layer of aluminum 301 underneath the photoresist material 305. Therefore, in the method of FIGS. 2A and 2B, the photoresist material 305 is capable of blocking both electron and ion transfer between the electrochemical solution 310 and the seed layer of aluminum 301 below the photoresist material 305. Therefore, even though electrical current flows through the portions of the seed layer of aluminum 301 below the photoresist material 305, these portions of the seed layer of aluminum 301 below the photoresist material 305 will not be transformed into AAO 307 because they cannot be contacted by the electrochemical solution 310 or have electron and/or ion exchange with the electrochemical solution 310. In this manner, the AAO 307 is formed in a self-assembled manner just in the prescribed areas 309 where seed layer of aluminum 301 is exposed through openings in the photoresist material 305 to the electrochemical solution 310.

It should be understood that the operations 209A, 209B, and 209C can be performed in any order and either sequentially or simultaneously so as to satisfy the following two conditions for AAO 307 formation: 1) contact of the portions of the seed layer of aluminum 301 that are exposed through openings in the photoresist material 305 with the electrochemical solution 310, and 2) application of positive voltage to the portions of the seed layer of aluminum 301 that are exposed through openings in the photoresist material 305. When these two conditions for AAO 307 formation are satisfied, the portions of the seed layer of aluminum 301 that are exposed through openings in the photoresist material 305 are transformed into AAO 307. In other words, the process to electrochemically form the AAO 307 has two required conditions: 1) electrical contact between the power supply 311 and the seed layer of aluminum 301 so that electrical current can be applied to the seed layer of aluminum 301 in prescribed areas 309 where AAO 307 is to be formed, and 2) direct contact between the electrochemical solution 310 and the seed layer of aluminum 301 in the prescribed areas 309 where AAO 307 is to be formed to enable ion exchange between the seed layer of aluminum 301 in the prescribed areas 309 and the electrochemical solution 310.

When the positive voltage is applied to the seed layer of aluminum 301, the portions of the seed layer of aluminum 301 that are exposed to the electrochemical solution 310 in the prescribed areas 309 will oxidize to form AAO 307 having a physical structure that includes a hexagonal pattern of holes. In various embodiments, the positive voltage applied to the seed layer of aluminum 301 in the operation 209C can be within a range extending from about 5 Volts (V) to about 500 V. Also, in some embodiments, the positive voltage can be applied to the seed layer of aluminum 301 in a ramped manner (i.e., increasing and/or decreasing manner) during formation of the AAO 307. In some embodiments, application of the positive voltage to the seed layer of aluminum 301 in a ramped manner can be defined/controlled to tune the AAO 307 hole profile. Lee provides examples of voltages that can be used in performing operation 209C.

The hexagonal pattern of holes in the AAO 307 is a result of how grain boundaries form within the AAO 307. Therefore, the holes are self-aligned to form the hexagonal pattern of holes in the AAO 307. It should be understood that the operation 209 can include control of various parameters, such as electrochemical solution 310 composition and/or temperature and/or pressure and/or flow rate, as well as control of the temperature of the seed layer of aluminum 301 and the voltage applied to the seed layer of aluminum 301, so as to control the physical properties of the AAO 307. Formation of the AAO 307 can be controlled so that the holes of the hexagonal pattern of holes extend completely through the AAO 307 so as to reveal/expose the areas 308 on the top surface of the underlying in-process material layer(s) 103. Characteristics of the hexagonal pattern of holes in the AAO 307, i.e., hole size (diameter) and hole pitch (P) (center-to-center spacing), are dependent upon the electrical voltage applied to the seed layer of aluminum 301 in operation 209C and the composition of the electrochemical solution 310. Therefore, the hole size and hole pitch (P) in the AAO 307 can be tuned by controlling the electrical voltage applied to the seed layer of aluminum 301 in operation 209C and the composition of the electrochemical solution 310. In some embodiments, the AAO 207 can be formed to have a hole diameter within a range extending from about 10 nanometers to about 100 nanometers. In some embodiments, the AAO 207 can be formed to have a hole diameter within a range extending from about 80 nanometers to about 100 nanometers. In some embodiments, the AAO 207 can be formed to have a hole pitch (P) (see FIG. 3E) within a range extending from about 150 nanometers to about 200 nanometers.

It should be understood that the AAO 307 is resistant to fluorine-based etchant. As with regular aluminum oxide, exposure of AAO 307 to the fluorine-based etching process causes formation of aluminum fluoride, which is not volatile and will persist and stay in place as a hardmask material. Therefore, in the fluorine-based plasma etching process, the AAO 307 can be used as a hardmask that has high etch selectivity against silicon (Si), polysilicon (polySi), silicon oxide (SiO), and silicon nitride (SiN). With the AAO 307 used as a hardmask, the hexagonal pattern of holes in the AAO 307 define the hole geometry and spacings that will be etched into the underlying in-process material layers(s) 103.

Figure 3F:
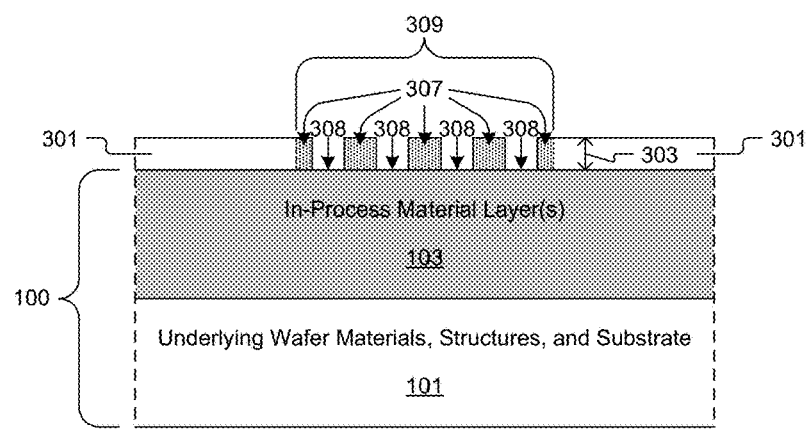
FIG. 3F shows the vertical cross-section through the section of the wafer as shown in FIG. 3D after removal of the photoresist material from the seed layer of aluminum, in accordance with some embodiments.

From the operation 209, the method of FIG. 2A proceeds with an operation 211 for removing the photoresist material 305 from the seed layer of aluminum 301. Operation 211 can be performed using a stripping process suitable for the photoresist material 305. FIG. 3F shows the vertical cross-section through the section of the wafer 100 as shown in FIG. 3D after completion of operation 211 to remove the photoresist material 305 from the seed layer of aluminum 301, in accordance with some embodiments.

Figure 3G:
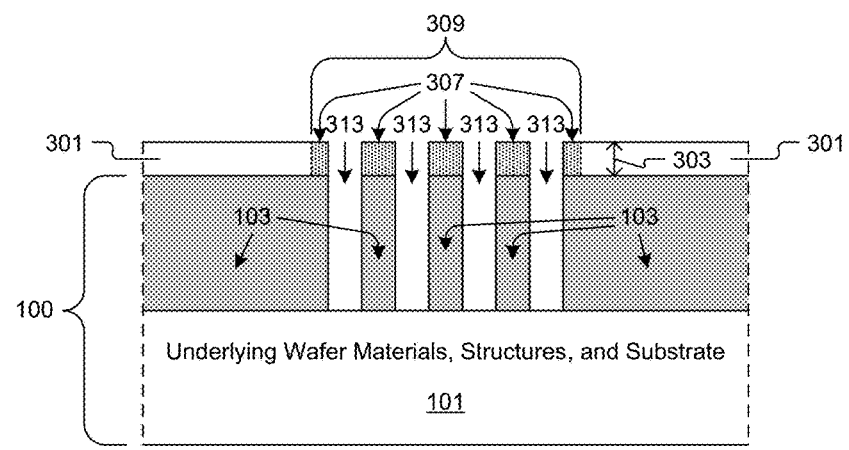
FIG. 3G shows the vertical cross-section through the section of the wafer as shown in FIG. 3F after etching holes through the underlying in-process material layer(s) at the areas that are exposed through the holes in the AAO, in accordance with some embodiments.

As with aluminum oxide and AAO, aluminum is also resistant to etching by fluorine-based etchant materials. Therefore, in some embodiments, after the photoresist material 305 is removed in the operation 211, the seed layer of aluminum 301 can be left as-is, i.e., as aluminum, during the subsequent plasma etching process. In these embodiments, the method proceeds from the operation 211 to an operation 215 in which holes 313 are etched through the underlying in-process material layer(s) 103 at the areas 308 that are exposed through the holes in the AAO 307. FIG. 3G shows the vertical cross-section through the section of the wafer 100 as shown in FIG. 3F after completion of operation 215 to etch holes 313 through the underlying in-process material layer(s) 103 at the areas 308 that are exposed through the holes in the AAO 307, in accordance with some embodiments.

In some embodiments, after the photoresist material 305 is removed in the operation 211, the method can proceed with an operation 213 in which portions of the seed layer of aluminum 301 that have not been transformed into AAO 307 are oxidized to form a film (dense film) of aluminum oxide 301A before the subsequent plasma etching process is performed. In some embodiments, the operation 213 includes performing a thermal oxidation process on the portions of the seed layer of aluminum 301 that have not been transformed into AAO 307. It should be understood that the film of aluminum oxide 301A that is formed in the operation 213 is a solid film that does not have holes like the AAO 307. By performing the operation 213 to oxidize the portions of the seed layer of aluminum 301 that were not transformed into AAO 307, the heterogeneity of the hardmask is reduced. Therefore, the process for etching the holes 313 through the underlying in-process material layer(s) 103 in the operation 215 can be defined with consideration of an aluminum oxide hardmask, as opposed to a hardmask that is heterogeneous combination of aluminum and aluminum oxide (in the form of AAO 307).

Figure 3H:
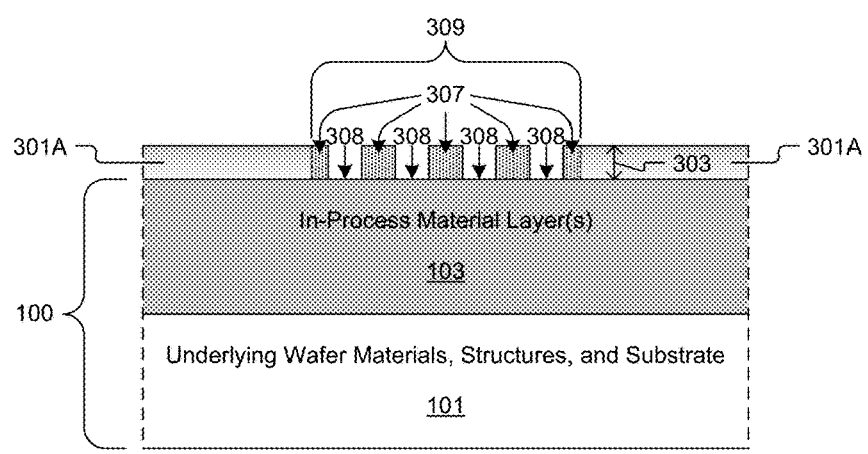
FIG. 3H shows the vertical cross-section through the section of the wafer as shown in FIG. 3F after oxidizing the portions of the seed layer of aluminum that were not transformed into AAO so as to form a dense film of aluminum oxide, in accordance with some embodiments.
Figure 3I:
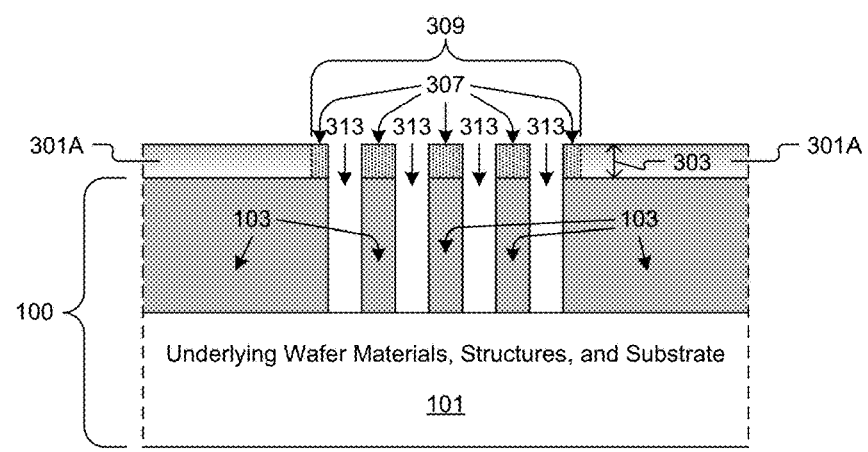
FIG. 3I shows the vertical cross-section through the section of the wafer as shown in FIG. 3H after etching holes through the underlying in-process material layer(s) at the areas that are exposed through the holes in the AAO, in accordance with some embodiments.

FIG. 3H shows the vertical cross-section through the section of the wafer 100 as shown in FIG. 3F after completion of operation 213 to oxidize the portions of the seed layer of aluminum 301 that were not transformed into AAO 307 so as to form the film (dense film) of aluminum oxide 301A, in accordance with some embodiments. After the operation 213, the method proceeds with the operation 215 to etch holes 313 through the underlying in-process material layer(s) 103 at the areas 308 that are exposed through the holes in the AAO 307, in accordance with some embodiments. FIG. 3I shows the vertical cross-section through the section of the wafer 100 as shown in FIG. 3H after completion of operation 215 to etch holes 313 through the underlying in-process material layer(s) 103 at the areas 308 that are exposed through the holes in the AAO 307, in accordance with some embodiments.

In some embodiments, the plasma etching process performed in operation 215 can be performed in an anisotropic manner to etch the holes 313 with high aspect ratio. The aluminum-based hardmask (that includes AAO 307 and portions of aluminum and/or dense film aluminum oxide) can provide an etching selectivity of up to 50 to 1, or higher, even in the presence of fluorine-based etchant materials. This high etching selectivity of the aluminum-based hardmask allows for deeper etching through the underlying in-process material layer(s) 103, because the aluminum-based hardmask will persist through longer etching times. Also, the high etching selectivity of the aluminum-based hardmask allows for a thinner aluminum-based hardmask as compared to the carbon-based hardmask. The reduced thickness of the aluminum-based hardmask helps to reduce an overall aspect ratio within the areas 308 where the holes 313 are etched at the end of the etching process. And, because the aluminum-based hardmask reduces the overall aspect ratio of the holes 313 at the end of the etching process, the time required to complete the etching process can be reduced. As previously mentioned, the thickness 303 of the seed layer of aluminum 301 is correlated to the thickness of the aluminum-based hardmask. In some embodiments, the thickness of the aluminum-based hardmask is within a range extending from about 100 nanometers to about 50 micrometers. In some embodiments, the thickness of the aluminum-based hardmask is about 2500 nanometers.

Figure 3J:
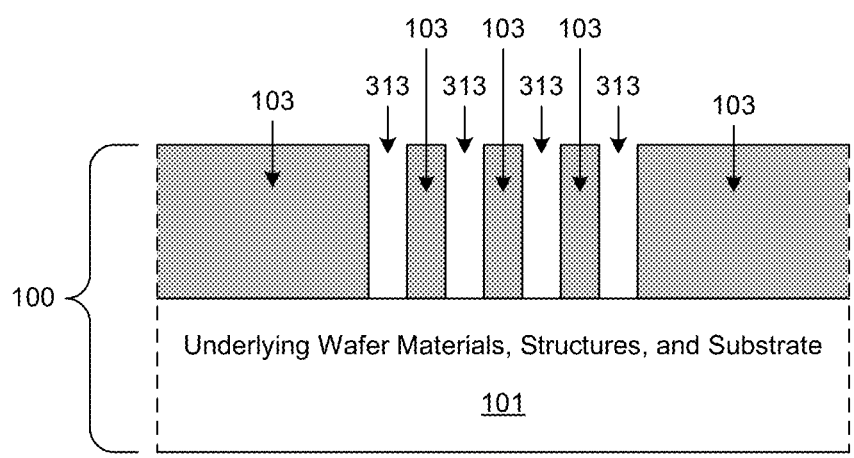
FIG. 3J shows the vertical cross-section through the section of the wafer as shown in either FIG. 3G or 3I after removal of the seed layer of aluminum, the AAO, and the aluminum oxide (if present) from the in-process material layer(s), in accordance with some embodiments.

After completion of operation 215 to etch holes 313 through the underlying in-process material layer(s) 103, the method proceeds with an operation 217 for removing the seed layer of aluminum 301, the AAO 307, and the aluminum oxide 301A (if present) from the in-process material layer(s) 103. The operation 217 can include performance of a wet cleaning process (using an acidic cleaning solution). The wet cleaning process can be performed in a wet cleaning chamber separate from the processing chamber in which the plasma-based etching process is performed. The wet cleaning process can remove the seed layer of aluminum 301, the AAO 307, and the aluminum oxide 301A (if present) without attacking silicon, silicon oxide, and silicon nitride that may be present on the wafer 100. FIG. 3J shows the vertical cross-section through the section of the wafer 100 as shown in either FIG. 3G or 3I after completion of operation 217 to remove the seed layer of aluminum 301, the AAO 307, and the aluminum oxide 301A (if present) from the in-process material layer(s) 103, in accordance with some embodiments.

In some embodiments, if a chemical incompatibility exists between the photoresist material 305 and the electrochemical solution 310, an electrochemically-compatible mask material 501 can be deposited over the seed layer of aluminum 301 before the photoresist material 305 is deposited. Then, the photoresist material 305 is patterned and developed for use as a mask to pattern the electrochemically-compatible mask material 501 so as to expose the prescribed areas 309 of the seed layer of aluminum 301 where AAO 307 is to be formed. Then, in various embodiments, the photoresist material 305 can be allowed to remain or can be removed when the electrochemical solution 310 is applied to the wafer 100 in operation 209. The electrochemically-compatible mask material 501 is chemically compatible with the electrochemical solution 310 and is capable of preventing electron and/or ion exchange between the electrochemical solution 310 and the seed layer of aluminum 301 during operation 209 to form AAO 307 in the prescribed areas 309.

Figure 4:
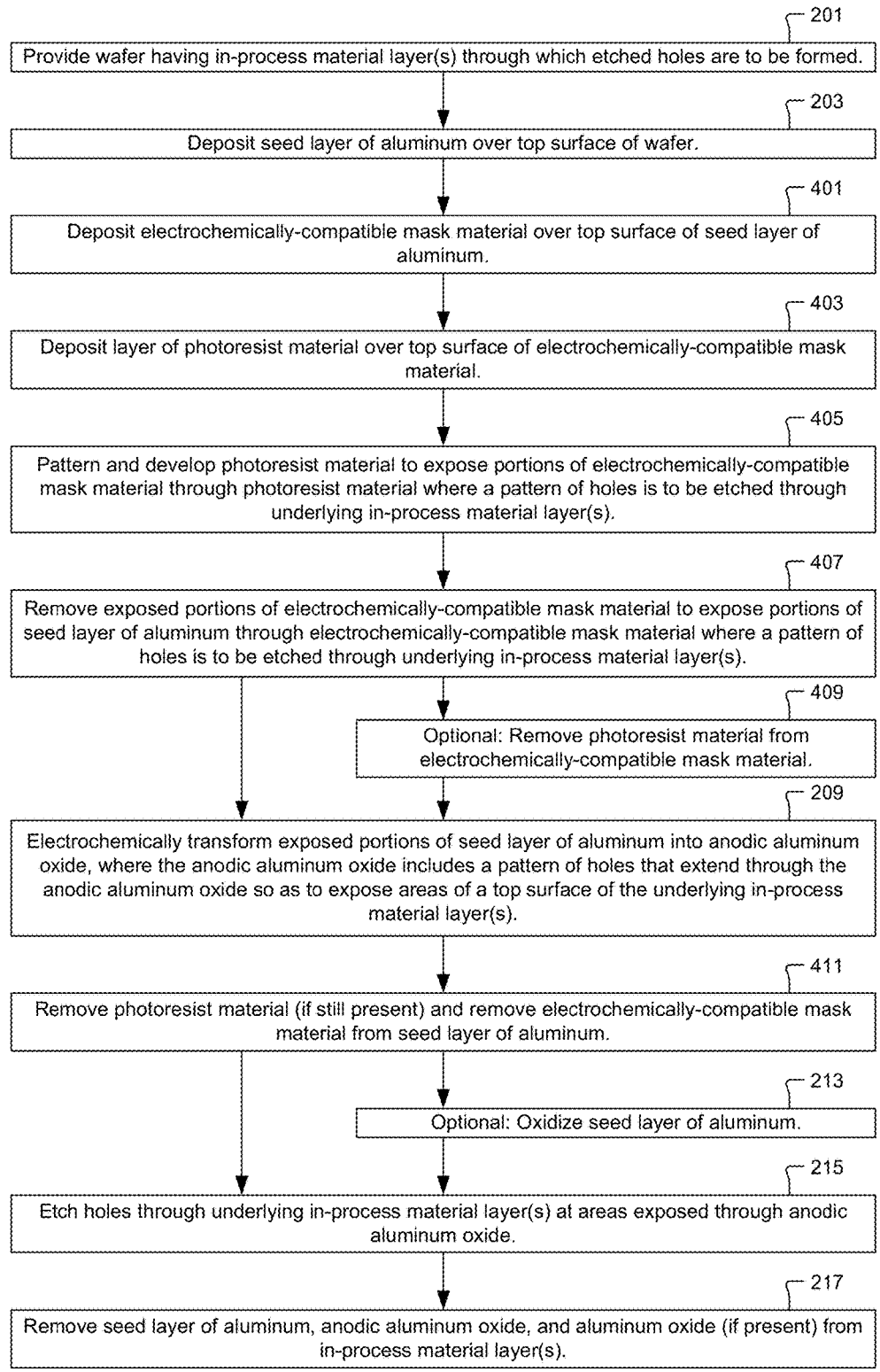
FIG. 4 shows a flowchart of a method for performing a plasma etching process that includes formation and use of AAO as a hardmask and that includes use of the electrochemically-compatible mask material, in accordance with some embodiments.
Figure 5A:
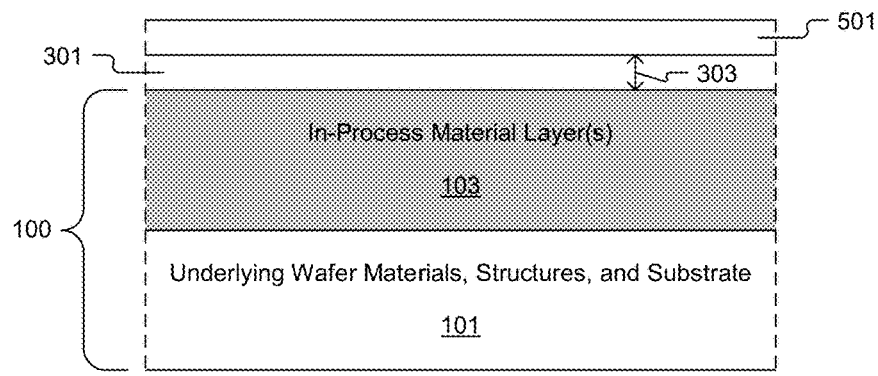
FIG. 5A shows the vertical cross-section through the section of the wafer as shown in FIG. 3A after depositing the layer of electrochemically-compatible mask material, in accordance with some embodiments.

FIG. 4 shows a flowchart of a method for performing a plasma etching process that includes formation and use of AAO as a hardmask and that includes use of the electrochemically-compatible mask material 501, in accordance with some embodiments. Operations 201 and 203 of FIG. 4 are the same as described with regard to FIG. 2A. In the method of FIG. 4, after the operation 203, the method proceeds with an operation 401 to deposit a layer of the electrochemically-compatible mask material 501 over the top surface of the seed layer of aluminum 301. FIG. 5A shows the vertical cross-section through the section of the wafer 100 as shown in FIG. 3A after completion of operation 401 to deposit the layer of electrochemically-compatible mask material 501, in accordance with some embodiments. The electrochemically-compatible mask material 501 is electrically insulative and substantially inert to acid within the electrochemical solution 310. In some example embodiments, the electrochemically-compatible mask material 501 is formed as a thin layer of silicon dioxide ($SiO_2$) having a thickness of about 30 nanometers to about 40 nanometers. However, it should be understood that in other embodiments, the electrochemically-compatible mask material 501 can be formed of a material other than silicon dioxide having an appropriate thickness to electrically insulate the seed layer of aluminum 301 from the electrochemical solution 310.

Figure 5B:
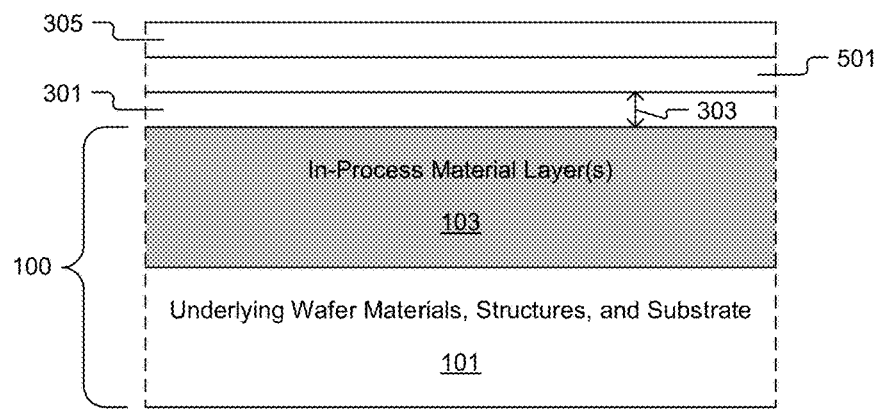
FIG. 5B shows the vertical cross-section through the section of the wafer as shown in FIG. 5A after depositing the layer of photoresist material, in accordance with some embodiments.
Figure 5C:
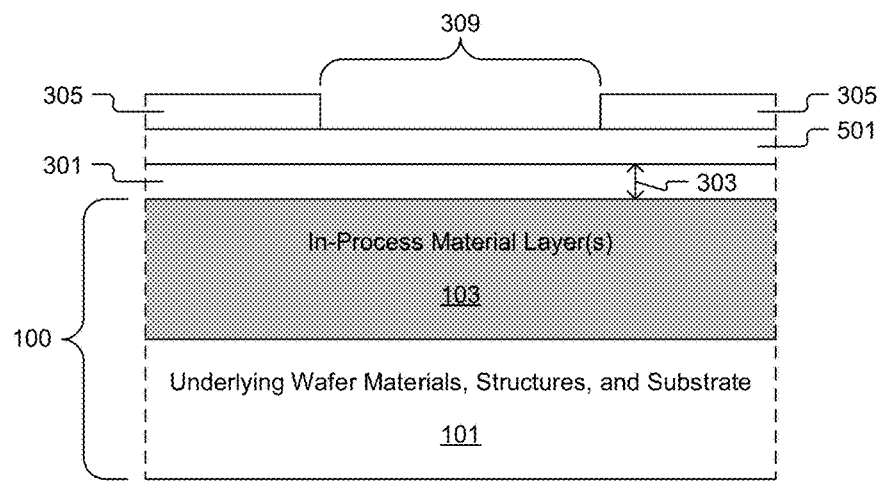
FIG. 5C shows the vertical cross-section through the section of the wafer as shown in FIG. 5B after patterning and developing the layer of photoresist material, in accordance with some embodiments.

From the operation 401, the method proceeds with an operation 403 for depositing the layer of photoresist material 305 over a top surface of the electrochemically-compatible mask material 501. FIG. 5B shows the vertical cross-section through the section of the wafer 100 as shown in FIG. 5A after completion of operation 403 to deposit the layer of photoresist material 305, in accordance with some embodiments. In an operation 405, the photoresist material 305 is patterned and developed to reveal/expose portions of the electrochemically-compatible mask material 501 that overlie the prescribed areas 309 where a pattern of holes is to be etched through the underlying in-process material layer(s) 103. It should be understood that the photoresist material 305 remains on portions of the electrochemically-compatible mask material 501 that do not overlie the prescribed areas 309 where the pattern of holes is to be etched through the underlying in-process material layer(s) 103. FIG. 5C shows the vertical cross-section through the section of the wafer 100 as shown in FIG. 5B after completion of operation 405 to pattern and develop the layer of photoresist material 305, in accordance with some embodiments. In the example of FIG. 5C, the patterning and developing of the photoresist material 305 in the operation 405 reveals/exposes portions of the electrochemically-compatible mask material 501 that overlie the prescribed areas 309 where the pattern of holes is to be etched through the underlying in-process material layer(s) 103.

Figure 5D:
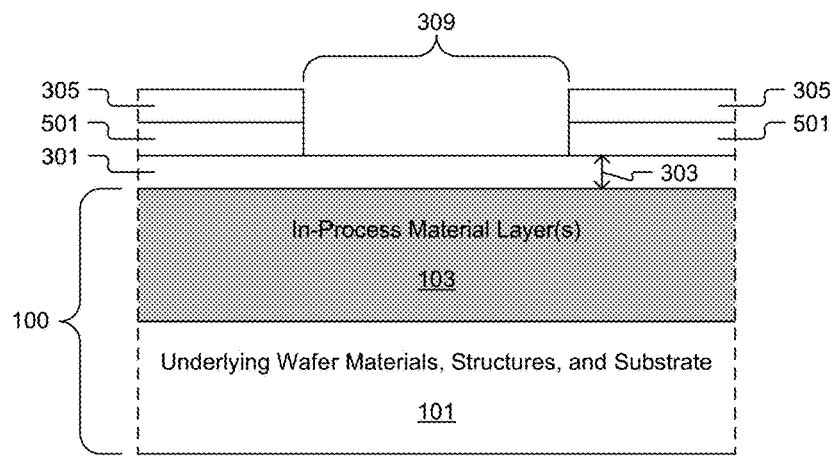
FIG. 5D shows the vertical cross-section through the section of the wafer as shown in FIG. 5C after removing the portions of the electrochemically-compatible mask material in the prescribed areas where the pattern of holes is to be etched through the underlying in-process material layer(s), in accordance with some embodiments.

The method proceeds with an operation 407 for removing the portions of the electrochemically-compatible mask material 501 that are revealed/exposed through openings that were formed in the layer of photoresist material 305 in operation 405. In the operation 407, the portions of the electrochemically-compatible mask material 501 are removed to reveal/expose the seed layer of aluminum 301 in the prescribed areas 309 where the pattern of holes is to be etched through the underlying in-process material layer(s) 103. FIG. 5D shows the vertical cross-section through the section of the wafer 100 as shown in FIG. 5C after completion of operation 407 to remove the portions of the electrochemically-compatible mask material 501 in the prescribed areas 309 where the pattern of holes is to be etched through the underlying in-process material layer(s) 103, in accordance with some embodiments.

In some embodiments, following the operation 407, the method can optionally proceed with an operation 409 to remove the photoresist material 305 from the electrochemically-compatible mask material 501 across the wafer 100. From the operation 409, the method proceeds with the operation 209 to electrochemically transform the exposed portions of the seed layer of aluminum 301 into AAO 307, as described with regard to FIGS. 2A and 2B. However, in some embodiments, the photoresist material 305 can be allowed to remain in place on the electrochemically-compatible mask material 501. In these embodiments, the method proceeds from operation 407 to operation 209.

Figure 5E:
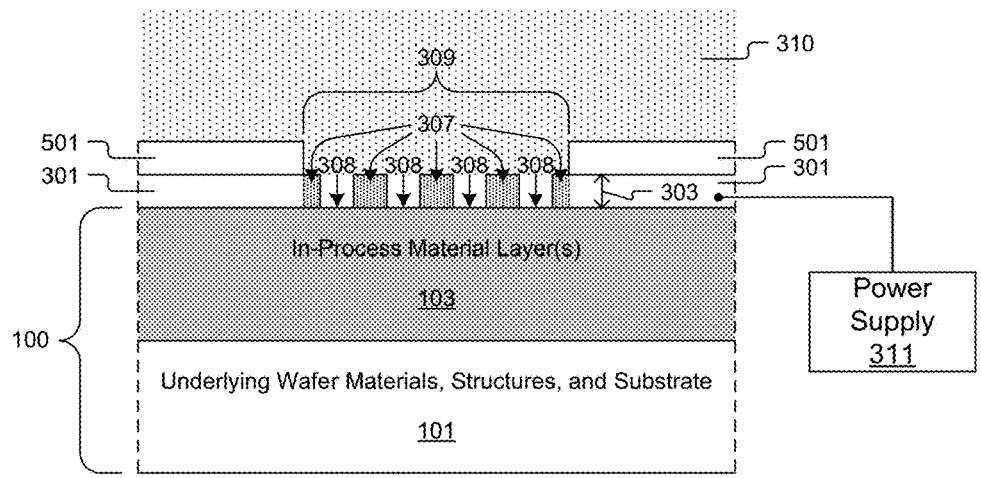
FIG. 5E shows the vertical cross-section through the section of the wafer as shown in FIG. 5D during an operation to electrochemically transform the exposed portion of the seed layer of aluminum in the prescribed area into AAO so as to reveal/expose the areas of the top surface of the underlying in-process material layer(s), in accordance with some embodiments.
Figure 5F:
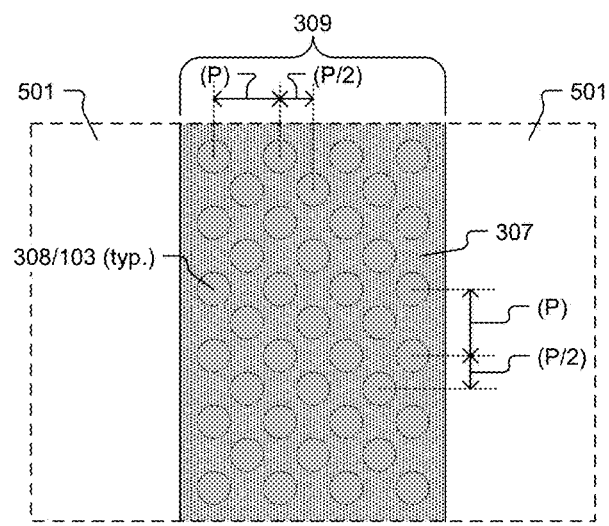
FIG. 5F shows a top view of the section of the wafer as shown in FIG. 5E after completion of the operation to electrochemically transform the exposed portion of the seed layer of aluminum in the prescribed area into AAO so as to reveal/expose the areas of the top surface of the underlying in-process material layer(s), in accordance with some embodiments.

FIG. 5E shows the vertical cross-section through the section of the wafer 100 as shown in FIG. 5D during operation 209 to electrochemically transform the exposed portion of the seed layer of aluminum 301 in the prescribed area 309 into AAO 307 so as to reveal/expose the areas 308 of the top surface of the underlying in-process material layer(s) 103, in accordance with some embodiments. FIG. 5F shows a top view of the section of the wafer 100 as shown in FIG. 5E after completion of operation 209 to electrochemically transform the exposed portion of the seed layer of aluminum 301 in the prescribed area 309 into AAO 307 so as to reveal/expose the areas 308 of the top surface of the underlying in-process material layer(s) 103, in accordance with some embodiments. Following the operation 209, the method proceeds with an operation 411 to remove any remaining photoresist material 305 (if still present) and the electrochemically-compatible mask material 501 from the wafer 100, i.e., from the seed layer of aluminum 301. Then, the method proceeds with operation 213 (optional), operation 215, and operation 217, as described with regard to FIG. 2A.

It should be understood that the methods disclosed herein for using AAO as a hardmask in a plasma-based etching process provides for high etch selectivity to enable etching of high aspect ratio features, such as encountered in memory hole etching through ONON and/or OPOP stacks in 3D NAND integrated circuit manufacturing. The AAO hardmask has much higher etch selectivity as compared to carbon-based hardmask materials, such as carbon or metal carbide or the like. Also, as disclosed herein, the AAO hardmask can be formed on the wafer using the electrochemical process so as to avoid chamber cleaning problems associated with PCVD and/or ALD aluminum oxide deposition on the wafer. Also, because the self-aligned hexagonal pattern of holes that occur within the AAO hardmask define the openings in the AAO hardmask through which underlying in-process layer(s) are etched, it is not necessary to perform a separate lithography-based process to create openings in the AAO hardmask. The formation and removal of the AAO hardmask can be done using wet processing methods.

In accordance with the methods disclosed herein, the hardmask formed of AAO in combination with the aluminum and/or aluminum oxide provides higher etch selectivity (up to 50 to 1 or greater) in fluorine-based plasma etching processes as compared to carbon-based hardmasks that provide an etch selectivity of 5 to 1 at the most. Also, in accordance with the methods disclosed herein, the electrochemical process provides for formation of the AAO hardmask in a self-aligned manner with holes present within the AAO hardmask. Therefore, it is not necessary to lithographically pattern the individual holes within the AAO hardmask, as is required when using other non-AAO hardmask materials. More specifically, lithography is used to expose the prescribed areas where the AAO hardmask is to be formed, but is not required to subsequently form the openings, i.e., individual holes, through the AAO material, because the openings through the AAO material are formed intrinsically when the AAO material is formed. Therefore, it should be understood that use of the AAO hardmask as disclosed herein eases lithography challenges, especially when etching closely spaced holes of small diameter, such as in 3D NAND integrated circuit manufacturing.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing disclosure has been presented in some detail for purposes of clarity of understanding, it will be apparent that certain changes and modifications can be practiced within the scope of the embodiments disclosed herein. Accordingly, the present embodiments are to be considered as illustrative and not restrictive, and the disclosure is not to be limited to the details given herein, but may be modified within the scope and equivalents of the described embodiments.

What is claimed is:

1. A method for performing a plasma etching process, comprising:
    depositing a seed layer of aluminum over a top surface of a wafer;
    depositing a layer of photoresist material over the seed layer of aluminum;
    patterning and developing the layer of photoresist material to expose one or more portions of the seed layer of aluminum through openings in the photoresist material;
    performing an electrochemical transformation process on the wafer to electrochemically transform the one or more portions of the seed layer of aluminum that are exposed through openings in the photoresist material into anodic aluminum oxide, wherein the anodic aluminum oxide includes a pattern of holes that extend through the anodic aluminum oxide to expose areas of the top surface of the wafer beneath the seed layer of aluminum;
    removing the photoresist material from the wafer; and
    exposing the wafer to a plasma to etch holes into the wafer at the areas of the top surface of the wafer that are exposed by the pattern of holes in the anodic aluminum oxide.

2. The method as recited in claim 1, wherein the electrochemical transformation process includes establishing an electrical connection between a power supply and the seed layer of aluminum, and wherein the electrochemical transformation process includes applying electrochemical solution to the one or more portions of the seed layer of aluminum that are exposed through openings in the photoresist material, and wherein the electrochemical transformation process includes operating the power supply to apply a positive voltage to the seed layer of aluminum so as to transform the one or more portions of the seed layer of aluminum that are exposed to the electrochemical solution through openings in the photoresist material into anodic aluminum oxide.

3. The method as recited in claim 2, wherein the electrochemical solution includes an acidic component.

4. The method as recited in claim 3, wherein the acidic component is one or more of phosphoric acid, sulfuric acid, oxalic acid, selenic acid, chromic acid, malonic acid, tartaric acid, citric acid, and malic acid.

5. The method as recited in claim 2, wherein the positive voltage is within a range extending from about 5 Volts (V) to about 500 V.

6. The method as recited in claim 2, wherein establishing the electrical connection between the power supply and the seed layer of aluminum includes electrically connecting the power supply to the seed layer of aluminum at multiple locations around a periphery of the wafer for substantially uniform electrical current distribution through the seed layer of aluminum.

7. The method as recited in claim 2, wherein establishing the electrical connection between the power supply and the seed layer of aluminum includes establishing a physically continuous electrical connection between the power supply and the seed layer of aluminum around a complete periphery of the wafer.

8. The method as recited in claim 2, further comprising:
    controlling a composition of the electrochemical solution and the positive voltage applied to the seed layer of aluminum to control physical characteristics of the pattern of holes in the anodic aluminum oxide, wherein the physical characteristics of the pattern of holes include a hole diameter and a hole pitch.

9. The method as recited in claim 8, wherein the hole diameter is within a range extending from about 10 nanometers to about 100 nanometers.

10. The method as recited in claim 8, wherein the hole pitch is within a range extending from about 150 nanometers to about 200 nanometers.

11. The method as recited in claim 1, wherein the seed layer of aluminum is deposited to have a thickness within a range extending from about 100 nanometers to about 50 micrometers.

12. The method as recited in claim 1, wherein the seed layer of aluminum provides a physically continuous electrical conduction layer during the electrochemical transformation process.

13. The method as recited in claim 1, wherein the photoresist material is chemically stable in exposure to the electrochemical solution.

14. The method as recited in claim 1, wherein the photoresist material is configured to prevent ion exchange through the photoresist material between the electrochemical solution and portions of the seed layer of aluminum that are covered by the photoresist material.

15. The method as recited in claim 1, further comprising:
after etching holes into the wafer, removing the anodic aluminum oxide and the seed layer of aluminum from the wafer.

16. The method as recited in claim 1, further comprising:
before exposing the wafer to the plasma, oxidizing a remaining portion of the seed layer of aluminum into a dense film of aluminum oxide, the remaining portion of the seed layer of aluminum corresponding to regions of the seed layer of aluminum that were not transformed into anodic aluminum oxide.

17. The method as recited in claim 16, wherein oxidizing the remaining portion of the seed layer of aluminum includes performing a thermal oxidation process.

18. A method for performing a plasma etching process, comprising:
depositing a seed layer of aluminum over a top surface of a wafer;
depositing a layer of mask material over the seed layer of aluminum;
depositing a layer of photoresist material over the layer of mask material;
patterning and developing the layer of photoresist material to expose one or more portions of the mask material;
removing the one or more portions of the mask material to expose corresponding portions of the seed layer of aluminum;
performing an electrochemical transformation process on the wafer to electrochemically transform the corresponding exposed portions of the seed layer of aluminum into anodic aluminum oxide, wherein the anodic aluminum oxide includes a pattern of holes that extend through the anodic aluminum oxide to expose areas of the top surface of the wafer beneath the seed layer of aluminum; and
exposing the wafer to a plasma to etch holes into the wafer at the areas of the top surface of the wafer that are exposed by the pattern of holes in the anodic aluminum oxide.

19. The method as recited in claim 18, further comprising:
removing the photoresist material from the wafer after removing the one or more portions of the mask material and before performing the electrochemical transformation process on the wafer.

20. The method as recited in claim 19, further comprising:
removing the mask material from the wafer after performing the electrochemical transformation process on the wafer and before exposing the wafer to the plasma to etch holes into the wafer.

* * * * *